United States Patent [19]

Miller et al.

[11] 4,053,739
[45] Oct. 11, 1977

[54] DUAL MODULUS PROGRAMMABLE COUNTER

[75] Inventors: Robert Lynn Miller, Streamwood; Robert Neal Weisshappel, Sleepy Hollow, both of Ill.

[73] Assignee: Motorola, Inc., Schaumburg, Ill.

[21] Appl. No.: 713,470

[22] Filed: Aug. 11, 1976

[51] Int. Cl.$^2$ .................. G06F 15/20; H03B 3/04
[52] U.S. Cl. ................... 364/703; 235/92 PE; 328/39; 328/48
[58] Field of Search ........... 235/150.3, 92 FQ, 92 PE; 307/220 R, 225 R, 271; 328/39, 41, 42, 46, 48, 133, 140

[56] References Cited

U.S. PATENT DOCUMENTS

| 3,353,104 | 11/1967 | Loposer | 328/39 |
| 3,594,551 | 7/1971 | Shearer et al. | 328/48 X |
| 3,605,025 | 9/1971 | Lincoln et al. | 235/92 PE X |
| 3,714,589 | 1/1973 | Lewis | 328/48 X |
| 3,959,737 | 5/1976 | Tanis | 328/42 X |
| 3,982,199 | 9/1976 | Green | 328/39 X |

Primary Examiner—Jerry Smith
Attorney, Agent, or Firm—James W. Gillman; James P. Hamley

[57] ABSTRACT

The inventive counter is operable to divide an input signal by the sum of two binary numbers, A and B. Each number is stored in memory. These numbers are alternately preset into a binary counter which also receives the input signal. A logic gate monitors the counter output and changes state when the number previously preset in the counter equals the accumulated count. The gate state transition is used to preset the counter with the alternate stored number. Thus, the process continues whereby the output from the logic gate represents the input signal divided by the sum of A and B.

5 Claims, 2 Drawing Figures

DUAL MODULUS PROGRAMMABLE COUNTER

BACKGROUND OF THE INVENTION

The present invention pertains to the electronic signal processing art and, in particular, to a programmable frequency counter.

Programmable frequency counters have been well known in the electronic processing art, particularly in the frequency synthesizer field. Frequency synthesizers commonly employ standard phase lock loop circuitry wherein a reference frequency oscillator signal may be divided by a selected one of a plurality of divisors thus providing an output signal of desired frequency. Previous techniques employed in digital frequency synthesizers have used, in the feedback portion of a conventional phase lock loop, a variable prescaler, and first and second counters. The first counter has been programmable and is used to divide the output of the variable prescaler by a fixed number (N). The second counter, often referred to as a swallow counter, has been used to switch the variable prescaler to a new divisor, or modulus, which new modulus is present during the counting of "N". As is discussed at page 10-3 of the Motorola "McMOS HANDBOOK", printed 1974 by Motorola, Inc., the total divisor $N_T$ of the feedback loop is given by:

$$N_T = (P + 1)A + P(N - A)$$

where, the variable modulus prescaler operates between two divisors $P$ and $P+1$, the swallow counter has a fixed divisor $A$, and the programmable divider has the divisor $N$.

While the above described frequency synthesizer provided the desired function, it requires a large number of parts and thus is expensive to manufacture. It is desirable, therefore, to provide the frequency synthesizer function using fewer parts.

SUMMARY OF THE INVENTION

It is an object of this invention, therefore, to provide an improved dual modulus programmable counter which is particularly suited for application in frequency synthesizers.

It is a particular object of the invention to provide the above dual modulus programmable counter which employs a minimum of components and, therefore, results in a minimum cost.

Briefly, according to the invention, a multiple modulus divider divides a signal having a frequency $f$ by a divisor $N = N_1 + M_2 + \ldots + M_x$, where $N, M_1, M_2, \ldots, M_x$ are selected numbers. The improved counter comprises a counter means which includes an input for receiving the signal to be divided, an output for producing a signal representative of the count of signals received at the input, and means to input a preset count state. Also included are a plurality of $M_x$ preset means, each of which is actuable to preset one of the numbers $M_1 \ldots M_x$ into the counter means. A control means responds to the count state at the counter output to sequentially actuate successive ones of the preset means in response to the counter counting to the count preset into the counter by the preceeding preset means. The control means produces an output waveform having transitions corresponding to the actuation of the predetermined preset means whereby the control means output waveform is of a frequency $f/N$.

The improved dual modulus programmable counter may be used in combination with further components to comprise a frequency synthesizer. In particular, additional frequency synthesizer components comprise a reference signal source for generating a reference signal frequency $f$. This signal is coupled, via appropriate means, to the first input of a phase comparator which compares this signal to the signal received at its second input, and produces an error signal representative of the phase difference therebetween at its output. The phase comparator error signal is processed for application to the control signal of a signal controlled oscillator which, in turn, responds by producing an oscillator signal of predetermined frequency. The output from the signal controlled oscillator couples to a prescaler which is actuable to frequency divide the oscillator signal by one of two predetermined divisors $P$, $P'$. The aforementioned dual modulus divider frequency divides the output from the prescaler by alternate stored divisors $A$ and $B$, where $A$ and $B$ are selected numbers. The divisor includes means to actuate the prescaler means from its $P$ divisor and its $P'$ divisor upon transition from the A divisor to the B divisor, and from its $P'$ divisor to its $P$ divisor upon transition from the B divisor to the A divisor. The output from the divider is coupled to the comparator second input whereby the oscillator signal tends to assume the frequency $f/(AP' + BP)$.

DESCRIPTION OF THE PREFERRED EMBODIMENT OF THE INVENTION

Figure 1:
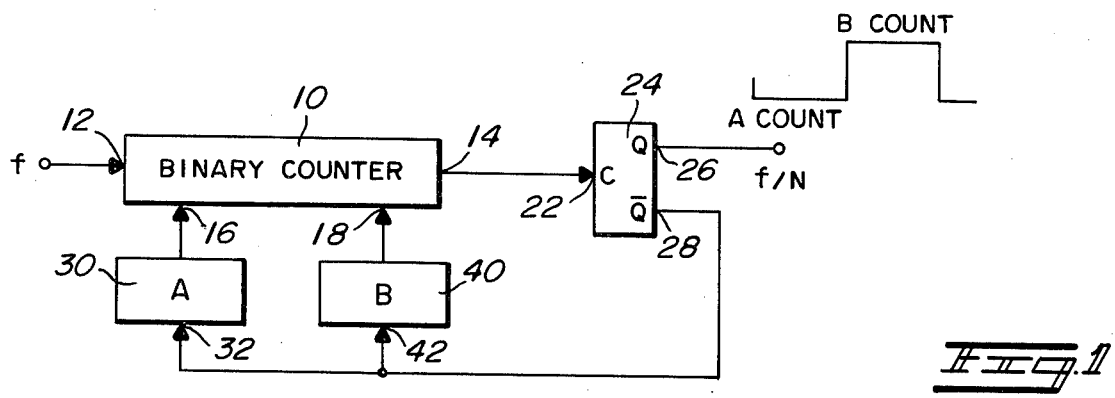
FIG. 1 is a schematic diagram illustrating the inventive dual modulus counter.

Referring to FIG. 1, a signal of frequency $f$, which is to be divided by a divisor $N$, is applied at the input 12 of a standard binary counter 10. The binary counter 10, operating in the well known manner, produces a signal at its output terminal 14 in response to a predetermined count of the input signal $f$. The binary counter 10 also has preset count input terminals 16, 18. A binary number coupled to one of the preset count inputs 16, 18 will activate the counter 10 to the binary number. In the present preferred embodiment of the invention, binary counter 10 is of the count-down type which means that a count state preset at the input terminals 16 or 18 will be decremated one count for each received input pulse at input 12. The binary counter 10 responds to counting down to a zero count state by changing its output logic state at output terminal 14.

A change in the output state at output 14 of binary counter 10 activates the "C" input 22 of a conventional control flip-flop 24. Flip-flop 24 has a first "Q" output 26 and a second "$\bar{Q}$" output 28. The control flip-flop 24 responds to transition state changes at its input 22 to alternately activate the Q output 26 high and low, with the $\bar{Q}$ output 28 correspondingly low and high.

The $\bar{Q}$ output 28 of the flip-flop 24 couples to the input terminals 32, 42 of a pair of preset storage registers 30, 40, respectively. Each register 30, 40 is programmed to contain a preset number. In this case preset register 30 contains the number A and preset register 40 contains the number B. Upon suitable activation at their inputs 32, 42 each register 30, 40 applies the number stored therein to the preset input terminals 16, 18 of the binary counter 10, activating the count in the same to the appropriate number A, B. Each number A, B corresponds to a modulus with which the input signal $f$ will be divided. In this preferred embodiment of the invention a dual modulus system is provided. Thus, there are two preset registers 30, 40 each containing the number A, B respectively. In a generalized system, any one of a number of divisors of modulus $M_1 + M_2 + \ldots + M_x$ might be used, in which case there would be a preset register for each, each containing the appropriate number $M_1, M_2, \ldots M_x$. For purposes of clarity the following discussion deals primarily with a dual modulus counter. Nonetheless, it should be understood that anyone of ordinary skill in the art could practice the invention by constructing a counter having more than two moduli.

Operation of the dual modulus programmable counter of FIG. 1 may be understood as follows.

Assume initially that the $\bar{Q}$ output 28 of the flip-flop 24 has activated preset register 30 to place the count A into the binary counter 10. Thus, each successive count of the input signal $f$ reduces the counter by one whereby, finally, the counter reaches a count of zero. At this time the counter output 14 makes a transition thereby activating the control input 22 of the flip-flop 24. At this point the Q output 26 and $\bar{Q}$ output 28 of flip-flop 24 make a transition to the opposite logic state. This transition causes the second preset register 40 to input the count B into the binary counter 10. Now successive input counts at input 12 of binary counter 10 due to the input signal $f$ reduce the count state of the counter 10 until it again reaches zero, at which point an output transition at output 14 once again activates the control input 22 of the flip-flop 24, thus activating preset register 30 to again input the count A into the binary counter 10.

Henceforth, the cycle repeats and the Q output 26 of the flip-flop 24 assumes a waveform having a frequency $f/N$, where $N = A + B$. Thus, with a minimum of components at input signal $f$ is divided by two moduli A, B, thereby dividing the input signal $f$ by the sum of the two moduli, N. As is discussed with reference to FIG. 2, the fact that the control flip-flop 24 produces an output transition after the A count period renders the instant dual modulus programmable counter extremely useful in frequency synthesizer applications.

Figure 2:
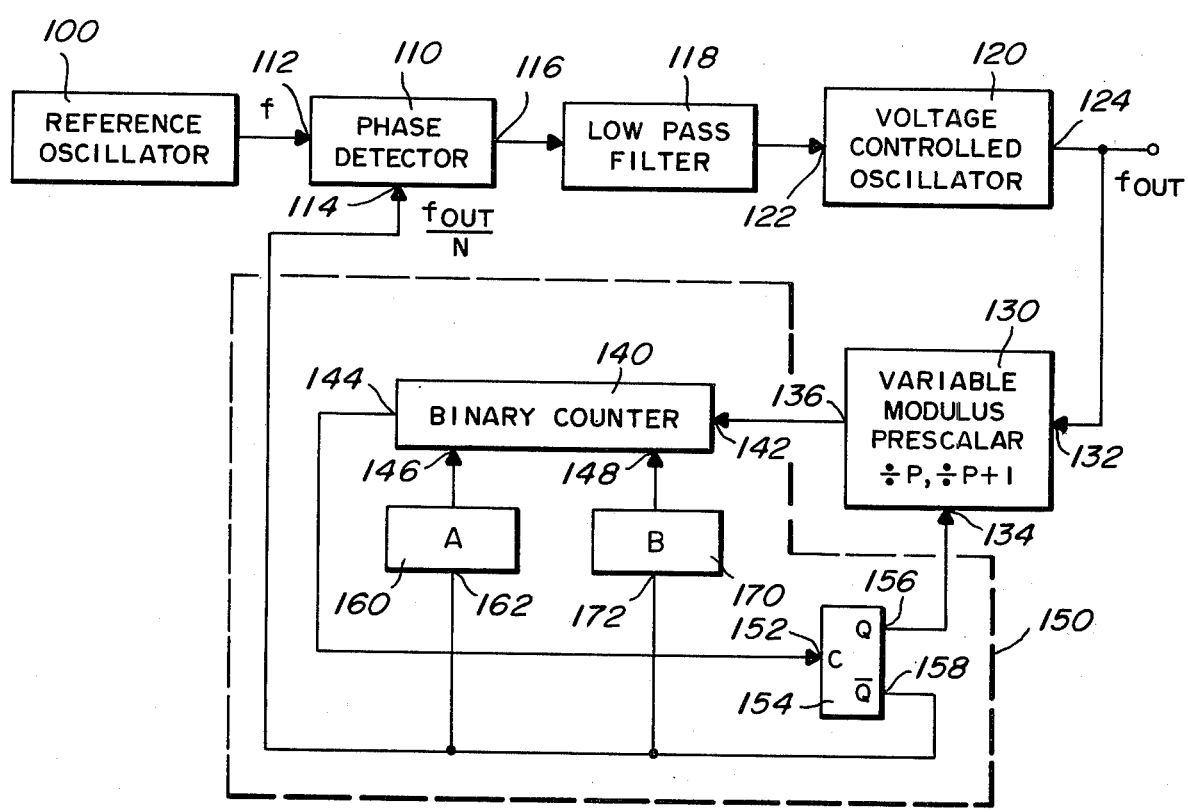
FIG. 2 is a schematic diagram illustrating a frequency synthesizer which employs the inventive counter.

FIG. 2 illustrates the preferred embodiment of a frequency synthesizer which employs the novel dual modulus programmable counter. There a standard phase lock loop chain includes a reference oscillator 100 which produces a reference signal of frequency $f$. The signal $f$ is fed to the first input 112 of a phase detector 110. Phase detector 110 has a second input 114 and an output 116. Acting in the conventional manner, the phase detector 110 produces an error signal at its output 116, which error signal is representative of the phase difference between signals received at the input terminals 112, 114.

In the conventional manner, the output error signal at output terminal 116 is low pass filtered through a low pass filter circuit 118 and applied to the control input 122 of a voltage controlled oscillator 120. The voltage controlled oscillator 120 produces an oscillator signal of predetermined frequency at its output 124 responsive to a control signal received at its control input 122. This oscillator output signal is the output signal $f_{out}$ of the frequency synthesizer.

The output terminal 124 of the voltage controlled oscillator 120 also feeds to the input terminal 132 of a variable modulus prescaler 130. The variable modulus prescaler 130 responds to a signal at its divisor input 134 to divide signals received at its input terminal 132 by either one of two moduli P, or P' reproducing the output frequency divided signal at its output terminal 136. In the preferred embodiment of the invention, P' = P + 1, however it should be understood that the selection of the P' modulus is one of individual designer's choice. The frequency divided output 136 of the variable modulus prescaler 130 is applied to the input terminal 142 of the dual modulus programmable counter 150. The dual modulus programmable counter 150 is seen to be identical to the preferred embodiment thereof illustrated in FIG. 1. For example, input terminal 142 is the input of a binary counter 140 corresponding to the binary counter 10 of FIG. 1. Binary counter 140 has an output 144 which feeds to the control input 152 of a control flip-flop 154. The control flip-flop 154 has a Q output 156 and a $\bar{Q}$ output 158. The Q output 158 actuates the inputs 162, 172 of the preset storage registers 160, 170 respectively. As before, each preset register 160, 170 contains preset numbers A, B, respectively, which, upon actuation via the input terminals 162, 172 feed their corresponding number into the binary counter 140 via the preset input terminals 146, 148.

The Q output 156 of the flip-flop 154 feeds to the modulus control terminal 134 of the variable modulus prescaler 130. A transition in logic state at input 134 causes the variable modulus prescaler 130 to alternate between the P and P+1 divisors. Finally, the $\bar{Q}$ output 158 of the control flip-flop 154 feeds to the second input 114 of the phase comparator 110.

Operation of the frequency synthesizer of FIG. 2 is understood as follows.

The reference oscillator 100 feeds a signal of frequency $f$ to the first input 112 of the phase detector 110. Phase detector 110, in turn, produces an error signal at its output 116 which, when low pass filtered via the filter 118, controls the voltage controlled oscillator 120. The oscillator output signal from the voltage controlled oscillator 120 is frequency divided by the variable modulus prescaler 130. Assuming that the variable modulus prescaler 130 is activated to its P modulus, the variable modulus prescaler 130 will produce an output transition at its output terminal 136 when it has counted P counts in the oscillator signal. At this time the first count is received by the binary counter 140 at its input 142. Stored within the binary counter 140 initially is the binary number A. Thus, this binary preset count is decremented by one count. This process continues until the variable modulus prescaler 130 counts to the number P, A times. After the binary counter 140 has counted down from its preset input A, it produces an output at output terminal 144 which in turn is applied to the control input 152 of the control flip-flop 144. This transition at the control input 152 causes the Q output 156 and $\bar{Q}$ output 158 to flip to their opposite states. Thus, the Q output 156 activates the variable modulus prescaler 130 to begin dividing by its second modulus P+1. Also, the $\bar{Q}$ output 158 causes the number B stored in register 170 to be fed into the binary counter 40. Now, the binary counter 140 does not change its output state at its output terminal 144 until the variable modulus prescaler has counted P+1 counts a total of B times.

Thereafter, the cycle repeats whereby the waveform at the Q output 158 of the flip-flop 154 is of a frequency $f_{out}/N_t$, where $N_t = A(P) + B(P+1)$. Now, in the conventional manner, the waveform $f_{out}/N_t$ is phase compared with the reference oscillator 100 signal $f$, whereby the two tend to phase lock producing the output signal $f_{out} = f/N_T$.

Thus, the dual modulus programmable counter 150 replaces the variable counter and the swallow counter of the prior art when used in a frequency synthesizer which provides an output signal which is the frequency division of a reference signal. Since the inventive dual modulus programmable counter does not require both a programmable counter, and a swallow counter, as has been known in the prior art, a significant reduction in parts count, and thus cost, has been achieved.

While a preferred embodiment of the invention has been described in detail, it should be understood that many modifications and variations thereto are possible, all of which fall within the true spirit and scope of the invention.

We claim:

1. A multiple modulus counter for dividing a signal having a frequency $f$ by a divisor $N = M_1 + M_2 + \ldots + M_x$, where $N, M_1, M_2, \ldots, M_x$ are selected numbers, comprising:

counter means including an input for receiving the signal to be divided, an output for producing a signal representative of the count of signals received at the input, and means to input a preset count state;

a plurality of $M_x$ preset means, each actuable to preset one of the numbers $M_1 \ldots M_x$ into the counter means;

control means responsive to the count state at the counter output to sequentially actuate a successive one of the preset means in response to the counter counting to the count preset into the counter by the preceding preset means, the control means producing an output waveform having transitions corresponding to the actuation of predetermined preset means, whereby the control means output waveform is of a frequency $f/N$.

2. A dual modulus counter for dividing a signal having a frequency $f$ by a divisor $N = A + B$, where N, A and B are selected numbers, comprising:

counter means including an input for receiving the signal to be divided, an output for producing a signal representative of the count of signals received at the input, and means to input a preset count state;

first preset means actuable to preset the count A in the counter means;

second preset means actuable to preset the count B in the counter means; and control means responsive to the count state at the counter output to sequentially actuate the second and first preset means in response to the counter counting the numbers A and B, respectively, the control means producing an output waveform having transitions at the times of actuating the first and second preset means, whereby the control means output waveform is of a frequency $f/N$.

3. A frequency synthesizer comprising:

a reference signal source for generating a reference signal of frequency $f$;

a phase comparator for producing at its output an error signal representative of the phase difference of signals received at its input;

means for coupling the reference signal source to the first phase comparator input;

a signal controlled oscillator for producing an oscillator signal of predetermined frequency at its output responsive to a received control signal;

means for processing the phase comparator error signal and producing a control signal in response thereto;

means for coupling the produced control signal to the signal controlled oscillator;

prescaler means actuable to frequency divide the oscillator signal by one of two predetermined divisors P, P';

a dual modulus divider for frequency dividing the output from the prescaler by alternate stored divisors A and B, where A and B are selected numbers, the dual modulus divisor including means to actuate the prescaler means from its P divisor to its P' divisor upon transition from the A divisor to the B divisor and from its P' divisor to its P divisor upon transition from the B divisor to the A divisor; and means for coupling the output from the dual modulus divider to the comparator second input, whereby the oscillator signal tends to assume the frequency $f/(AP + BP')$.

4. The frequency synthesizer of claim 3 wherein $P' = P + 1$.

5. The frequency divisor of claim 3 wherein the dual modulus divider comprises:

counter means including an input for receiving the prescaler output signal, an output for producing a signal representative of the count of signals received at the input, and means to input a preset count state;

first preset means actuable to preset the count A in the counter means;

second preset means actuable to preset the count B in the counter means; and control means responsive to the count state at the counter output to sequentially actuate the second and first preset means in response to the counter counting the numbers A and B, respectively, the control means producing an output waveform having transitions at the times of actuating the first and second preset means.

* * * * *